US008653529B2

(12) United States Patent
Ishibe et al.

(10) Patent No.: US 8,653,529 B2
(45) Date of Patent: Feb. 18, 2014

(54) SEMICONDUCTOR DEVICE AND METHOD OF MANUFACTURING THE SAME

(75) Inventors: Shinzo Ishibe, Ora-gun (JP); Katsuhiko Kitagawa, Ota (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 22 days.

(21) Appl. No.: 13/092,633

(22) Filed: Apr. 22, 2011

(65) Prior Publication Data

US 2011/0260276 A1 Oct. 27, 2011

(30) Foreign Application Priority Data

Apr. 27, 2010 (JP) ................................. 2010-101977

(51) Int. Cl.
*H01L 29/04* (2006.01)
*H01L 21/339* (2006.01)

(52) U.S. Cl.
USPC ............... 257/72; 257/21; 257/184; 257/215; 257/234; 257/E31.001; 438/60; 438/75; 438/144

(58) Field of Classification Search
USPC ............ 257/233, 257–258, 290–294, 21, 53, 257/54, 72, 80, 183, 186, 213, 215, 222, 257/226, 234, 414, 428, 431, 434, 436, 461, 257/678, E31.001, E31.081, E31.107, E31, 257/158; 438/60, 75, 144
See application file for complete search history.

(56) References Cited

U.S. PATENT DOCUMENTS

| 5,563,429 A * | 10/1996 | Isogai ........................... 257/258 |
| 6,512,809 B2 * | 1/2003 | Doubrava et al. ............... 378/19 |
| 2008/0135967 A1 * | 6/2008 | Kitagawa et al. .............. 257/434 |

FOREIGN PATENT DOCUMENTS

| CN | 1567574 | 1/2005 |
| CN | 1838422 | 9/2006 |
| WO | WO-99/40624 | 8/1999 |

OTHER PUBLICATIONS

Klo et al. High speed OFIC with offset drift compensation for bluray disc system. Proc. of SPIE, vol. 7219: Optoelectronic Integrated Circuits, 2009, pp. 72190E-1-72190E-7.*

* cited by examiner

*Primary Examiner* — Cuong Q Nguyen
*Assistant Examiner* — Galina Yushina
(74) *Attorney, Agent, or Firm* — Morrison & Foerster LLP

(57) ABSTRACT

In a semiconductor device in which a glass substrate is attached to a surface of a semiconductor die with an adhesive layer being interposed therebetween, it is an object to fill a recess portion of an insulation film formed on a photodiode with the adhesive layer without bubbles therein. In a semiconductor die in which an optical semiconductor integrated circuit including a photodiode having a recess portion of an interlayer insulation film in the upper portion, an NPN bipolar transistor, and so on are formed, generally, a light shield film covers a portion except the recess portion region on the photodiode and except a dicing region. In the invention, an opening slit is further formed in the light shield film, extending from the recess portion to the outside of the recess portion, so as to attain the object.

10 Claims, 7 Drawing Sheets

SEMICONDUCTOR DEVICE AND METHOD OF MANUFACTURING THE SAME

CROSS-REFERENCE OF THE INVENTION

This application claims priority from Japanese Patent Application No. 2010-101977, filed Apr. 27, 2010, the content of which is incorporated herein by reference in its entirety.

BACKGROUND OF THE INVENTION

1. Field of the Invention

The invention relates to a CSP (Chip Size Package) type semiconductor device and a method of manufacturing the same, in particular, a semiconductor device and a method of manufacturing the same in which a supporting substrate is attached to a surface of a semiconductor substrate with an adhesive layer being interposed therebetween.

2. Description of the Related Art

A CSP technique keeps an unchallengeable status as a three-dimensional packaging technique while a portable device or the like is designed to be more lightened, thinned and shortened. The CSP means a small package of which the outer dimensions are almost the same as those of a semiconductor die.

Among CSP type semiconductor devices, a brief description will be given about a semiconductor device having a photoelectric integrated circuit as a CSP, that includes a light receiving element such as an image sensor, a control circuit controlling an output of the image sensor, and so on, referring to FIGS. 6A and 6B. FIG. 6A is a perspective view of the semiconductor device on the front surface side, and FIG. 6B is a perspective view of the semiconductor device on the back surface side.

The semiconductor device 101 is formed so that a semiconductor die 104 is sealed between first and second glass substrates 102, 103 with epoxy resins 105a, 105b being interposed therebetween. A plurality of ball-shaped conductive terminals 106 are disposed in a grid pattern on one surface of the second glass substrate 103, i.e., on the back surface of the semiconductor device 101.

These conductive terminals 106 are connected to the semiconductor die 104 through second wirings 110. Aluminum wirings led from inside the semiconductor die 104 are connected to the plurality of second wirings 110 respectively, achieving electric connection between the conductive terminals 106 and the semiconductor die 104.

A cross-sectional structure of the semiconductor device 101 will be described in detail referring to FIG. 7. FIG. 7 shows the cross-sectional view of the semiconductor device 101 completed by dividing each of the semiconductor dies 104 along dicing lines.

A first wiring 107 is provided on an insulation film 108 disposed on the front surface of the semiconductor die 104 on which a light receiving element such as an image sensor or the like is formed, being connected to the image sensor or the like. This semiconductor die 104 is attached to the first glass substrate 102 with a resin 105a. The back surface of this semiconductor die 104 is attached to the second glass substrate 103 with a resin 105b.

One end of the first wiring 107 is connected to the second wiring 110. This second wiring 110 is extended from one end of the first wiring 107 to the front surface of the second glass substrate 103. The ball-shaped conductive terminals 106 are formed on the second wiring 110 extended on the second glass substrate 103, forming the CSP type semiconductor device 101.

A CSP type semiconductor device having a light receiving element such as an image sensor or the like is disclosed in many documents, and also in the Japanese Patent Application Publication No. 2002-512436.

The Japanese Patent Application Publication No. 2002-512436 discloses attaching the semiconductor die 104 and the first glass substrate 102 and attaching the semiconductor die 104 and the second glass substrate 103 with an epoxy resin using an attaching apparatus. This document discloses this attaching apparatus as having a system that rotates while pressing the semiconductor die 104, the glass substrate 102 or 103 and an epoxy resin so as to realize an optimum attachment state with a uniformly spread epoxy resin.

On the other hand, in order to prevent decrease in the amount of light entering the light receiving element due to a passivation silicon nitride film that is formed on the upper surface of the light receiving element and absorbs light entering the semiconductor die 104, the passivation silicon nitride film on the region of the light receiving element need be removed. Therefore, a recess portion is formed on the region of the light receiving element, being lower than the surrounding control circuit region.

With this structure, when an adhesive layer for attaching the semiconductor die 104 and the glass substrate 102 or the like is applied by high speed rotation, there may occur a problem that the recess portion is filled with an epoxy resin as an adhesive material with bubbles. From the aspect of the yield and reliability, it is important to prevent bubbles from being mixed in the adhesive layer that fills the recess portion formed on the region of the light receiving element.

SUMMARY OF THE INVENTION

The invention provides a semiconductor device that includes a semiconductor die, a semiconductor integrated circuit formed on a front surface of the semiconductor die and having a light receiving element, an insulation film formed on the semiconductor integrated circuit and having a recess portion on the light receiving element, a light shield film formed on the insulation film and having an opening on the recess portion and an opening slit extending, in plan view of the light shield film, from the recess portion toward outside of the recess portion, a pad electrode disposed on the semiconductor die and connected to the semiconductor integrated circuit, a supporting substrate attached to the front surface of the semiconductor die, an adhesive layer disposed between the semiconductor die and the supporting substrate so as to attach the supporting substrate to the front surface of the semiconductor die, and a back surface wiring electrode formed on a back surface of the semiconductor die and connected to the pad electrode.

The invention also provides a method of manufacturing a semiconductor device. The method includes providing a semiconductor die having a semiconductor integrated circuit including a light receiving element formed on a front surface of the semiconductor die, forming an insulation film on the semiconductor integrated circuit, forming a recess portion by etching the insulation film on the light receiving element, forming a light shield film on the insulation film, patterning the light shield film so as to form an opening on the recess portion, to remove the light shield film from a dicing region and to form an opening slit extending from the recess portion toward outside of the recess portion, forming a pad electrode connected to the semiconductor integrated circuit near the dicing region, attaching a supporting substrate to the front surface of the semiconductor die using an adhesive, and forming a back surface wiring electrode connected to the pad electrode on a back surface of the semiconductor die

DETAILED DESCRIPTION OF THE INVENTION

Figure 1:
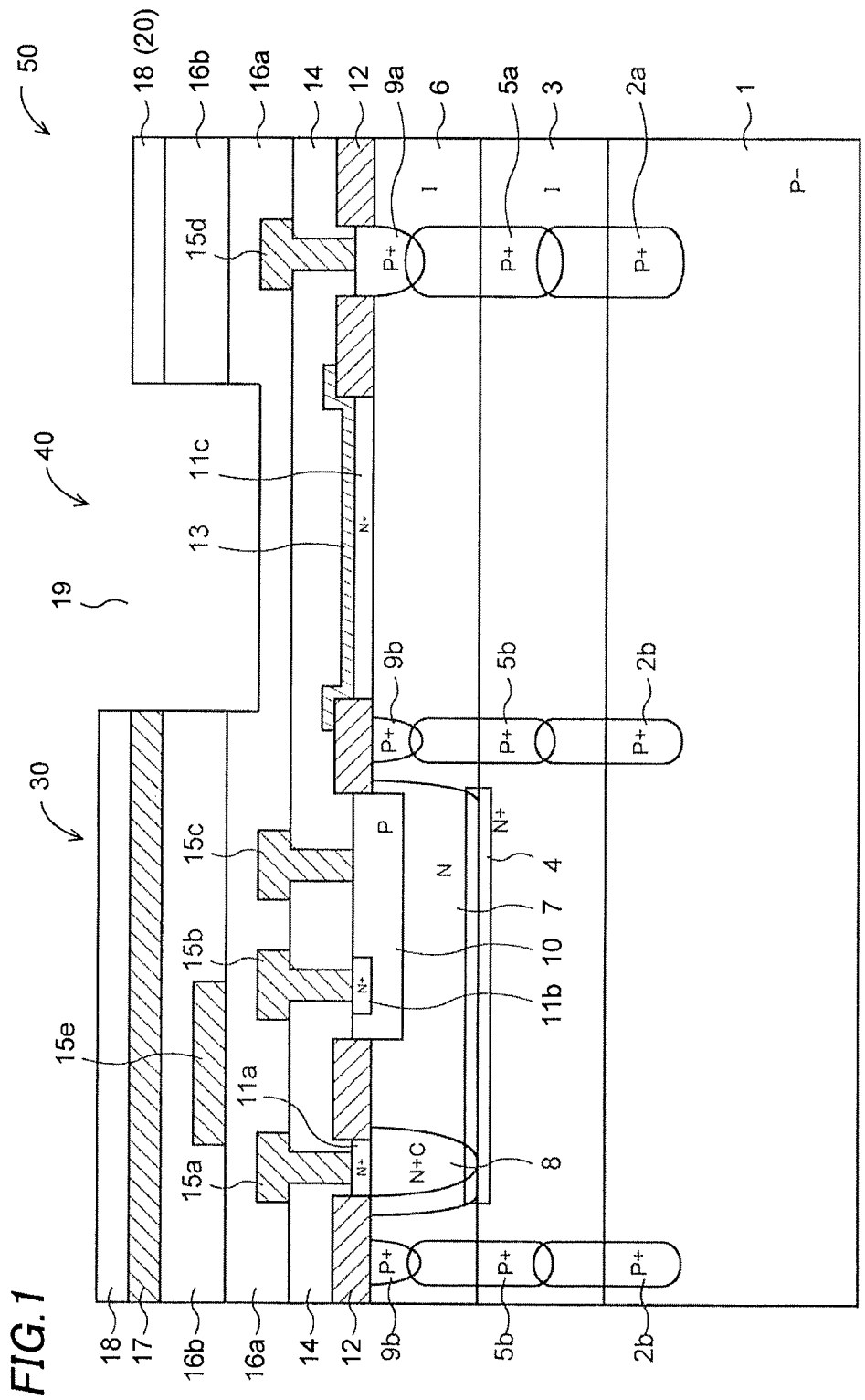
FIG. 1 is a cross-sectional view showing a method of manufacturing a semiconductor device of an embodiment of the invention.

A semiconductor die 50 shown in FIG. 5 showing a feature of a semiconductor device 60 in an embodiment of the invention will be described hereafter by showing a cross-sectional view of the semiconductor die 50 in FIG. 1 and a plan view of an opening state of a light shield film 17 in FIG. 2. The cross-sectional view in FIG. 1 shows a portion of the opening slit 20 in FIG. 2. Since a transparent resin such as an epoxy resin that is not burned by Blu-ray irradiation is developed in recent years, a photoelectric integrated circuit in which a Blu-ray compatible photodiode 40 is also included in the semiconductor die 50 of the embodiment.

First, as shown in FIG. 1, an intrinsic semiconductor layer (I layer) 3 and an intrinsic semiconductor layer (I layer) 6 made of high resistance epitaxial layers formed on a P− type semiconductor substrate 1 are divided in a plurality of regions by P+ type isolation layers 2a, 2b, 5a, 5b, 9a, 9b and so on. The regions divided by the P+ type isolation layer 2b and so on are further divided by an element isolation layer 12. The photodiode 40, an output control circuit for the photodiode 40, an NPN bipolar transistor 30 as an example, and so on are formed in the regions divided by these isolation layers.

The P+ type isolation layers 2a, 5a of the photodiode 40 form a P+ type anode electrode lead layer, the P+ type isolation layer 9a forms a P+ type anode layer 9a, and the P+ type anode layer 9a and an anode electrode 15d are connected through a contact hole formed in an insulation film 14. An N+ type cathode layer 11c is formed on the front surface of the I layer 6 in the photodiode 40, and an anti-reflection layer 13 made of a silicon nitride film is formed thereon. Furthermore, the N+ type cathode layer 11c is connected to a cathode electrode (not shown) through a contact hole (not shown) formed in the insulation film 14.

An N+ type embedded layer 4 is formed on the front surface of the I layer 3 in the region of the NPN bipolar transistor 30, and an N type collector layer 7 extending from the front surface of the I layer 6 to the N+ type embedded layer 4 is formed. In the N type collector layer 7, an N+ type collector lead layer (N+ C layer) 8 extending from the front surface to the N+ type embedded layer 4 is formed, and a P type base layer 10 is also formed.

An N+ type collector layer 11a and an N+ type emitter layer 11b are formed on the front surface of the N+ C layer 8 and the P type base layer 10, respectively. A collector electrode 15a, an emitter electrode 15b and a base electrode 15c connected to the N+ type collector layer 11a, the N+ type emitter layer 11b and the base layer 10 through contact holes of the interlayer insulation film 14 are formed.

An interlayer insulation film 16a is formed on the whole surface of the semiconductor substrate 1 including on the collector electrode 15a and so on of the NPN bipolar transistor 30, and an electrode wiring 15e and so on are formed on the interlayer insulation film 16a. Furthermore, the light shield film 17 made of metal is formed thereon with an interlayer insulation film 16b being interposed therebetween, and a passivation film 18 is formed thereon.

On the other hand, the interlayer insulation film 16b and so on on the photodiode 40 are etched by a predetermined photo etching process and the light shield film 17 is also etched and removed, thereby forming a recess portion 19 having a predetermined depth on the photodiode 40.

Figure 2:
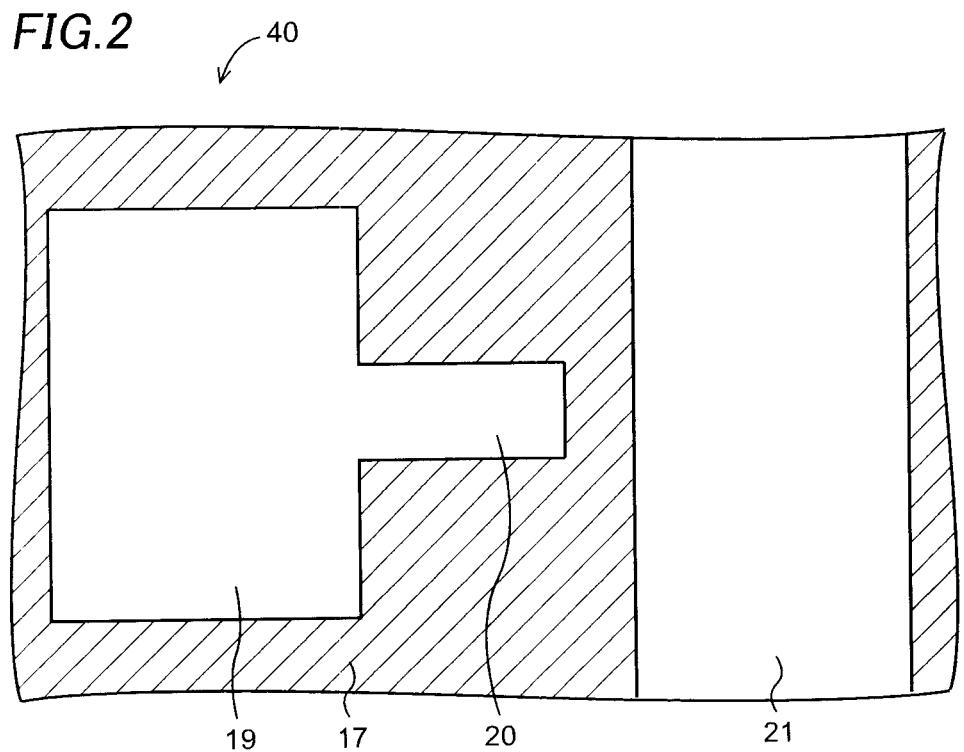
FIG. 2 is a plan view showing an opening slit of a light shield film of the embodiment of the invention, the opening slit extending from a recess portion on a photodiode of the semiconductor device to the outside of the recess portion.

In this case, as shown in FIGS. 1 and 2, the etching of the light shield film 17 is performed not only in the recess portion 19 portion on the photodiode 40 and on a dicing region 21 and also performed so as to form an opening slit 20 extending from the recess portion 19 on the photodiode 40 to the outside of the recess portion 19. It is noted that in this case the light shield film 17 in the opening slit 20 may not be totally removed and may be partially left so as to keep a light shield function.

In FIG. 2, the opening slit 20 is formed in the perpendicular direction to the dicing region 21, but the direction is not limited to this. The width or length of the opening slit 20 may be arbitrarily determined. As described above, the forming of the opening slit 20 in the light shield film 17, that extends from the recess portion 19 on the photodiode 40 to the outside of the recess portion 19 is a feature of the invention. The effect of the opening slit 20 is as follows.

Figure 5A:
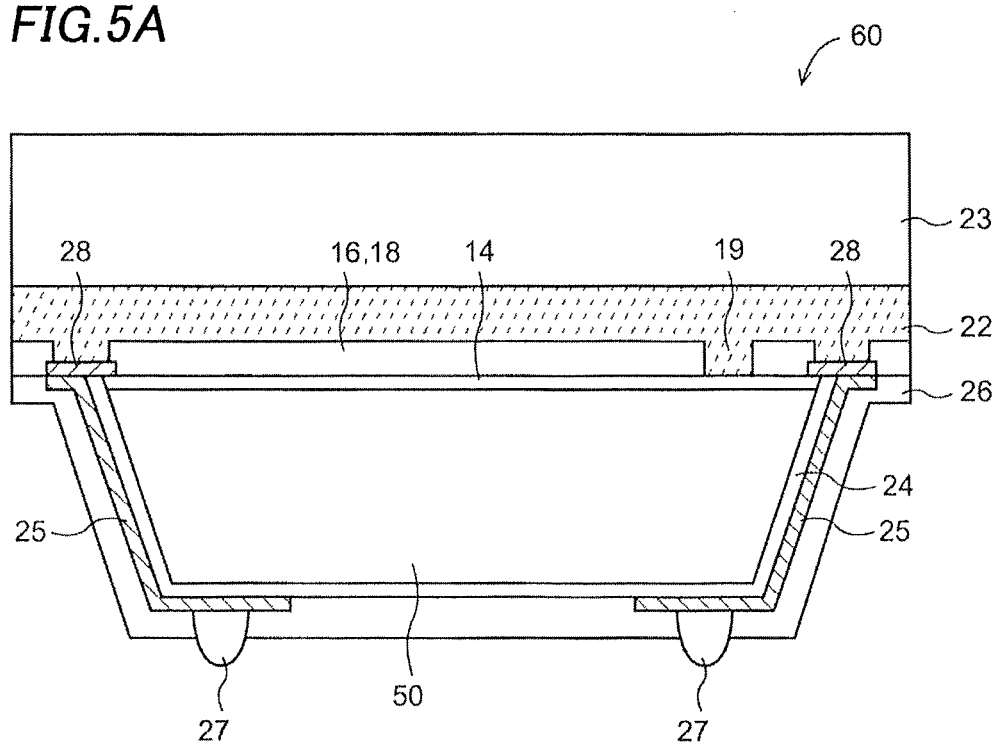
FIG. 5A is a cross-sectional view showing the semiconductor device and the method of manufacturing the same of the embodiment of the invention.
Figure 5B:
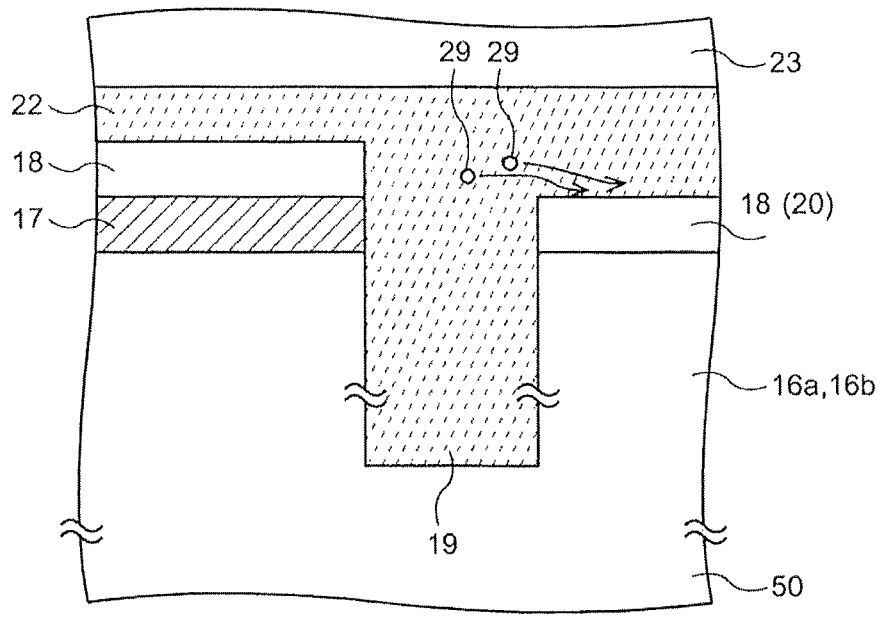
FIG. 5B is an enlarged cross-sectional view showing the recess portion and the opening slit shown in FIG. 2.
Figure 6A:
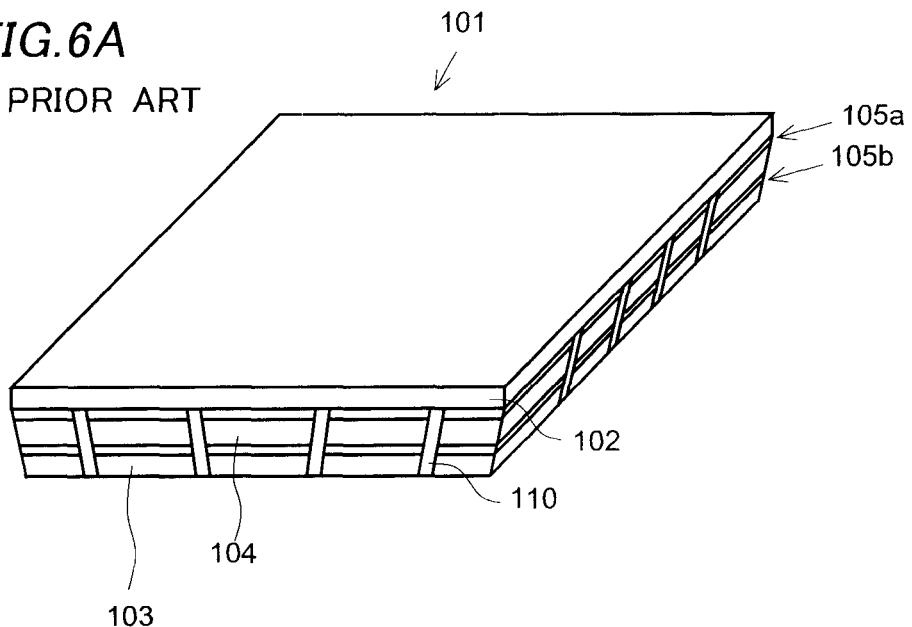
FIG. 6A is a perspective view of a conventional semiconductor device on the front surface side.
Figure 6B:
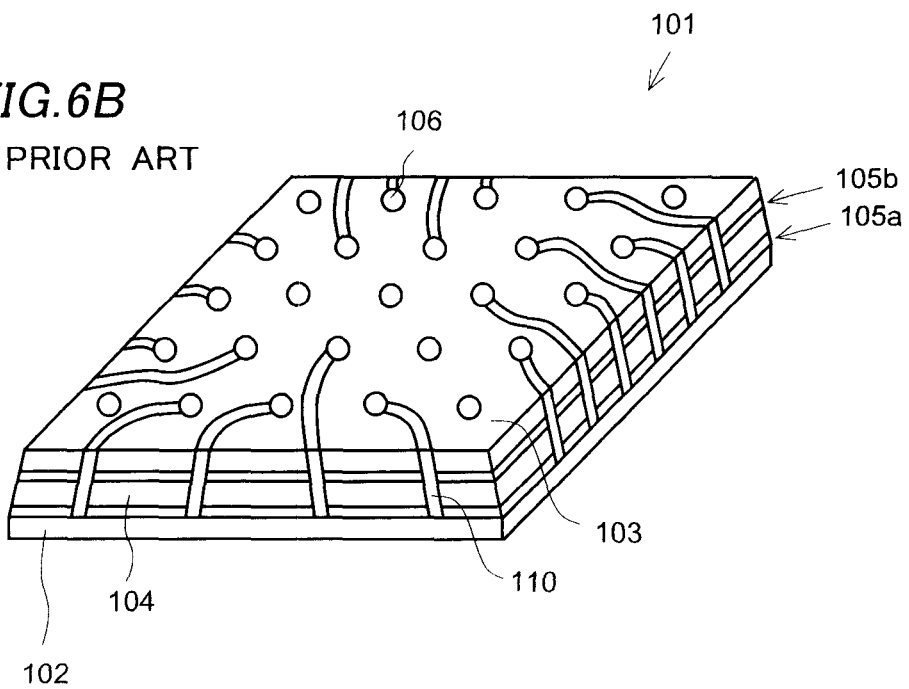
FIG. 6B is a perspective view of the conventional semiconductor device on the back surface side.
Figure 7:
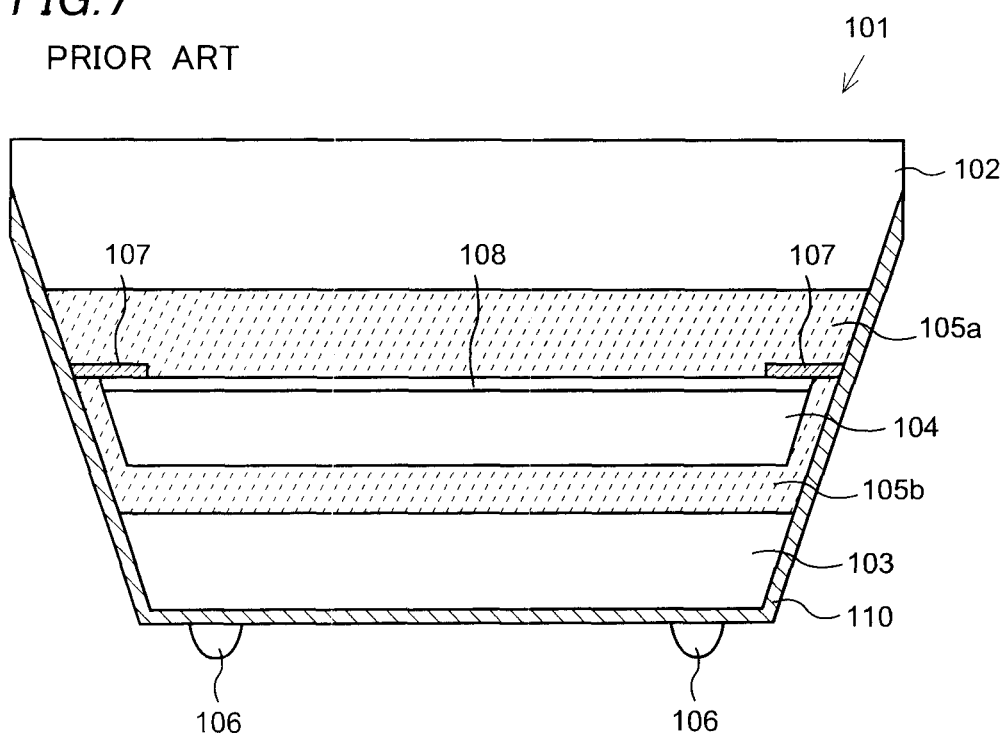
FIG. 7 is a cross-sectional view of the conventional semiconductor device.

As described above, the opening slit 20 is formed by totally removing the light shield film 17 in the opening slit 20 or thinning the light shield film 17 in the opening slit 20. Accordingly, a recess portion is formed on the surface of the passivation film 18 when the passivation film 18 is formed on the light shield film 17. Bubbles 29 taken in the adhesive layer 22 in the recess portion 19 are discharged to the opening slit 20 because the recess portion of the passivation film 18 is connected with the recess portion 19 as shown FIG. 5B When a glass substrate 23 is attached to the semiconductor die 50 with an adhesive layer 22 to form the semiconductor device 60 as shown in FIG. 5A, the opening slit 20 prevents bubbles 29 from being taken in the adhesive layer 22 filling the recess portion 19 on the photodiode 40 of the semiconductor die 50. Such bubbles 29 are caused by air taken in when an adhesive made of a transparent resin is applied on the semiconductor substrate 1 and spread on the whole surface of the semiconductor substrate 1 by rotating the semiconductor substrate 1.

When bubbles 29 are mixed in the adhesive layer 22 in the recess portion 19, incident light is diffused at the boundary of the adhesive layer 22 etc and the bubbles 29 and the amount of light reaching the photodiode 40 decreases, thereby causing the sensitivity reduction and variation of the photodiode 40. Therefore, the prevention of bubbles 29 entering the recess portion 19 is a feature of the invention having an important effect in stabilizing the sensitivity of the photodiode 40.

Bubbles 29 taken in the adhesive layer 22 filling the recess portion 19 may be largely decreased by setting the depth of the recess portion 19 to a predetermined depth and adjusting the rotation start speed when the adhesive layer 22 is applied by the rotation to an optimum value. However, by providing the opening slit 20 extending from the recess portion 19 to the outside of the recess portion 19, even if there are bubbles 29 taken in the recess portion 19, the bubbles 29 taken in the recess portion 19 are discharged to the opening slit 20.

Another effect of the opening slit 20 will be described hereafter. As shown in FIG. 5, in the process of attaching the semiconductor die 50 and the glass substrate 23 with the adhesive layer 22 to form the semiconductor device 60, an adhesive made of a transparent resin is applied to the semiconductor die 50 first as described above. The semiconductor die 50 is then rotated so that the adhesive layer 22 spreads uniformly on the whole surface of the semiconductor die 50. At this time, the high speed rotation of 1000 rotations per minute is needed so as to provide the adhesive layer 22 with a uniform thickness.

In this case, the recess portion 19 of the semiconductor die 50 near the periphery of the semiconductor substrate 1 including multiple semiconductor dies 50 runs in the air at extremely high speed. In other words, supposing the recess portion 19 is not rotated, air above the recess portion 19 flows at high speed. Then, as indicated by the Bernoulli law, air in the recess portion 19 in the high-speed air flow is taken out by the air flowing at high speed and the recess portion 19 turns to a low pressure state.

The adhesive made of a viscous transparent resin flowing from the center region of the semiconductor substrate 1 by the centrifugal force of the rotation drops in the recess portion 19 in the low pressure state, and fills the recess portion 19 in the more compressed state than when it fills the recess portion 19 under ordinary pressure. If the glass substrate 23 is attached in this state, the adhesive layer 22 filling the recess portion 19 has a large inner stress and may cause cracks or the like by a heat cycle or the like.

In this case, light entering the photodiode 40 is diffused by the cracks or the like of the adhesive layer 22, and the amount of light reaching the photodiode 40 decreases to cause reduction or variation in the sensitivity of the photodiode 40. Even if such a problem does not occur at the time of shipping, the reliability decreases if the problem occurs during use. Addressing this problem is another feature of the invention.

The opening slit 20 extending from the recess portion 19 to the outside of the recess portion 19 in the invention achieves preventing cracks or the like in the adhesive layer 22 in a reliability test such as a heat cycle or the like even in the recess portion 19 on the photodiode 40 near the periphery of the semiconductor substrate 1. This is because that the existence of the opening slit 20 causes a portion of the adhesive layer 22 that drops in the recess portion 19 in the low pressure state on the photodiode 40 in the periphery of the semiconductor substrate 1 to flow into the opening slit 20 by high speed rotation, and releases the inner stress of the adhesive layer 22 in the recess portion 19.

Figure 3:
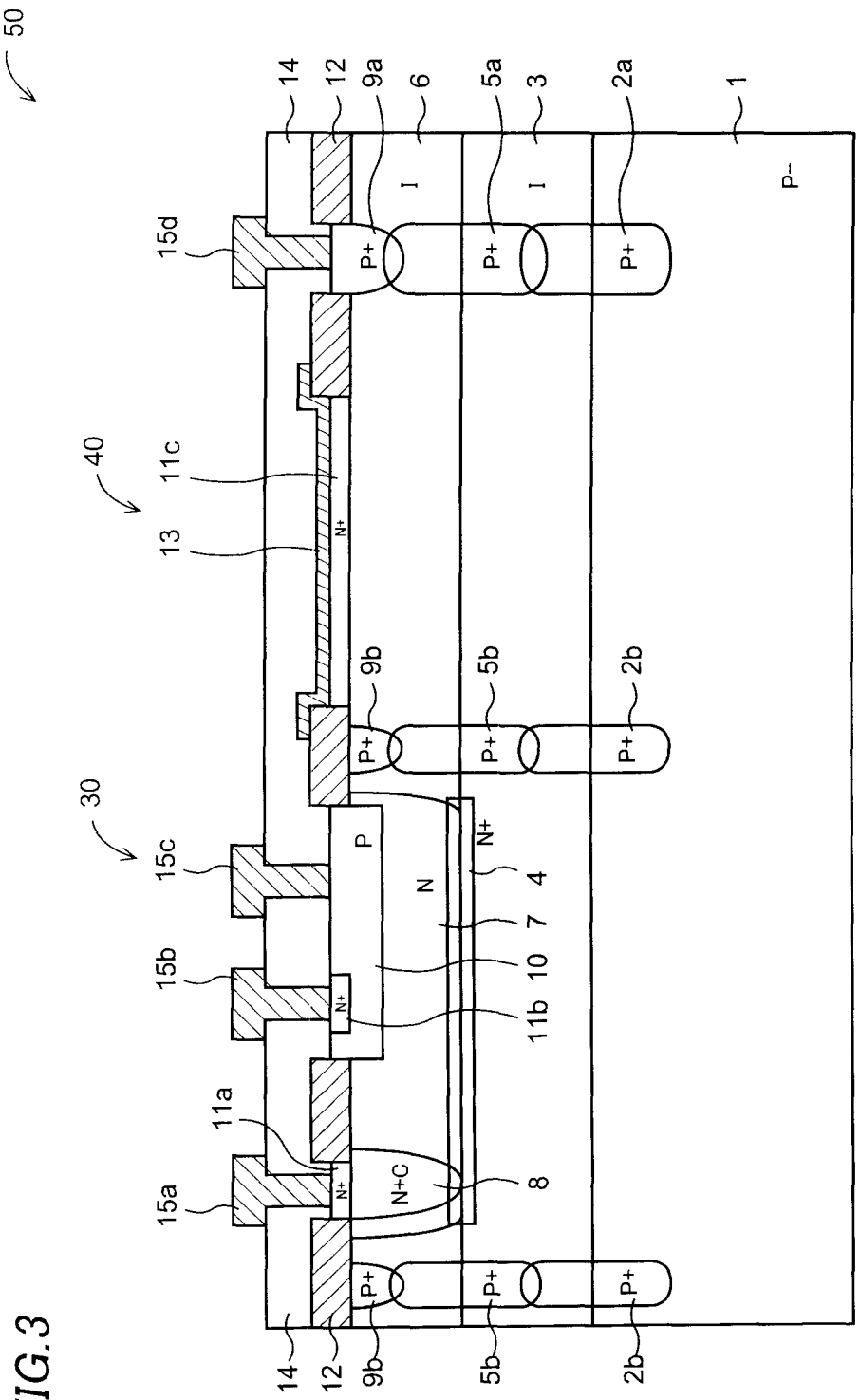
FIG. 3 is a cross-sectional view showing the method of manufacturing the semiconductor device of the embodiment of the invention.

A method of manufacturing the semiconductor device of the embodiment will be described referring to FIGS. 1 to 5. First, as shown in FIG. 3, the P− type semiconductor substrate 1 is provided and a P+ type embedded layer (no shown) is formed on the front surface. Although this is shown by the P+ type anode electrode lead layer 2a and the P+ type isolation layer 2b and these are isolated in the figure, these are formed on the whole front surface of the P− type semiconductor substrate 1 in actual. This is to achieve high speed operation by decreasing electric resistance to a light current due to holes generated in the depletion layer of the photodiode 40.

The I layer 3 made of a high resistance layer is then formed by a predetermined epitaxial method as shown in the figure. The P+ type anode electrode lead layer 5a and the P+ type isolation layer 5b are then formed on the front surface of the I layer 3, and the N+ type embedded layer 4 is further formed in the region of the NPN bipolar transistor 30. The I layer 6 made of a high resistance layer is formed on the I layer 3 on which the N+ embedded layer 4 and so on are formed by an epitaxial method. The reason that the epitaxial layer is formed as the I layer 3 and the I layer 6 made of high resistance layers is to form the photodiode 40 as a PIN diode.

The N type collector layer 7 extending from the front surface of the I layer 6 to inside the N+ type embedded layer 4 in the region of the NPN bipolar transistor 30 is formed by ion implantation of impurity ions such as phosphorus and a heat treatment thereafter. Furthermore, in the N type collector layer 7, the N+ type collector lead layer (N+C) 8 extending from the front surface of the N type collector layer 7 to inside the N+ type embedded layer 4 is formed by ion implantation of impurity ions such as phosphorus and a heat treatment thereafter.

Then the P type base layer 10 is formed in the N type collector layer 7 by ion implantation of impurity ions such as boron. The N+ type collector layer 11a, the N+ type emitter layer 11b and the N+ type cathode layer 11c are then formed by ion implantation of impurity ions such as arsenic. The P+ type isolation layer 9b and the P+ type anode layer 9a are further formed by ion implantation of impurity ions such as boron. The element isolation film 12 is also formed by a predetermined method. By a final heat treatment, the P+ type isolation layer 2b, 5b and 9b are connected and the P+ type anode layer 9a and the P+ type anode lead layer 2a, 5a are also connected.

The anti-reflection film 13 made of a silicon nitride film is then formed in the region of the photodiode 40 by a predetermined CVD method and photo etching. The insulation film 14 covering the whole surface of the semiconductor substrate 1 is then formed. The insulation film 14 is made of a silicon oxide film by a low pressure TEOS method, BPSG and so on and achieves planarization. The total thickness is thinner than 1 μm.

The contact holes are formed in the insulation film 14 by a predetermined photo etching process, and the collector electrode 15a, the emitter electrode 15b, the base electrode 15c, the anode electrode 15d and a cathode electrode (not shown) are formed through the contact holes by a predetermined process, as first layer wirings made of aluminum or the like. Pad electrodes 28 shown in FIG. 5 connected to the control circuit including the NPN bipolar transistor 30 and so on are formed near the dicing region.

Figure 4:
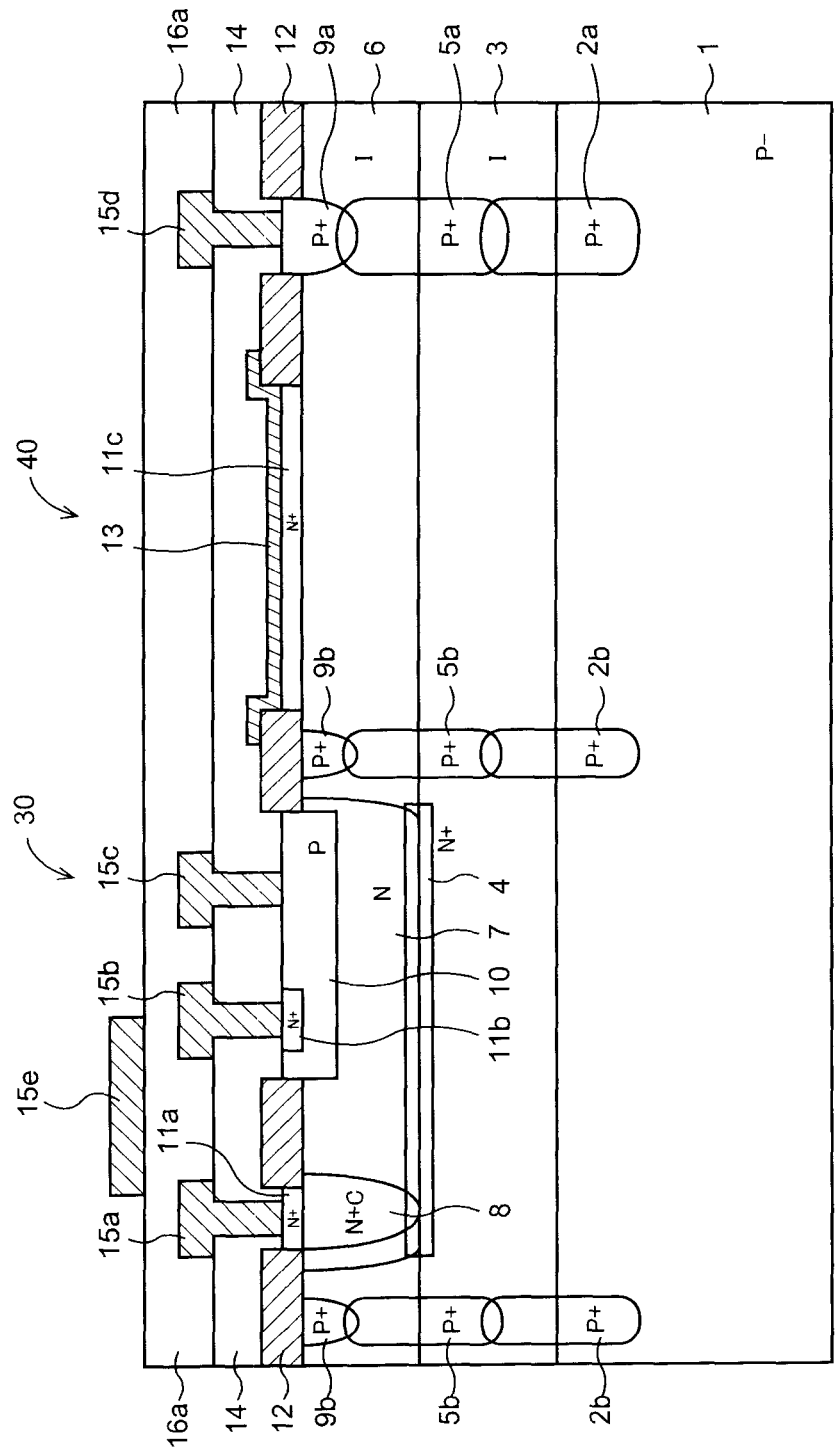
FIG. 4 is a cross-sectional view showing the method of manufacturing the semiconductor device of the embodiment of the invention.

Then, as shown in FIG. 4, the interlayer insulation film 16a is formed on the whole front surface of the semiconductor substrate 1 on which the collector electrode 15a and so on are formed by a predetermined method. The interlayer insulation film 16a is made of a low pressure TEOS film and a SOG film and planarizes the front surface of the semiconductor substrate 1. The SOG film is deposited on the photodiode 40 since a height difference is large thereon. The total thickness of the interlayer insulation film 16a is also thinner than 1 μm. The second layer wiring 15e and so on are then formed by a predetermined method.

Then, as shown in FIG. 1, the interlayer insulation film 16b is deposited on the whole front surface of the semiconductor substrate 1 on which the second wiring layer 15e and so on are formed. The interlayer insulation film 16b is made of a low pressure TEOS film and a SOG film and the total thickness is thinner than 1 μm. A predetermined photo etching treatment is then performed to a metal film that is deposited on the semiconductor substrate 1 by sputtering or the like, the metal film being made of a light shield material such as aluminum (Al) of which the surface is covered by titanium nitride (TiN).

As a result of this, the light shield film 17 made of metal is formed, which has an opening on the photodiode 40, exposes the dicing region 21, and has the opening slit 20 extending from the opening on the photodiode 40 to the outside of the opening. In this case, the light shield film 17 in the opening slit 20 may be partially left so as to keep the light shield function as described above.

The passivation film 18 made of a silicon nitride film or the like is then deposited on the front surface of the P type semiconductor substrate 1 on which the light shield film 17 is formed. Then, the passivation film 18 on a probe pad electrode made of a metal film mainly containing Al or the like covered by TiN (not shown) and the TiN on the Al or the like are removed by etching to expose the Al surface on the probe pad electrode.

At this time, simultaneously, the passivation film 18 made of SiN having high light absorbency that causes a problem in the sensitivity design of the photodiode 40 need be removed from on the photodiode 40 by etching so that enough light reaches the photodiode 40.

The etch removing of the passivation film 18 and the TiN film on the probe pad electrode and the etch removing of the passivation film 18 on the photodiode 40 may be performed using separate masks or may be performed at the same time using a same mask. The case of separate masks has an advantage that the recess portion 19 that will be described below is formed shallower than in the case of a same mask, and the case of a same mask has an advantage that the manufacturing process is more simplified. The following description will be given using the recess portion 19 that is formed using a same mask for process simplification as an example.

While the passivation film 18 on the probe pad electrode and the passivation film 18 on the photodiode 40 have the same thickness and removed by etching almost simultaneously, the interlayer insulation film 16b on the photodiode 40 is also partially etched since the passivation film 18 is over-etched so as not to leave an etching residue of the passivation film 18.

The TiN film covering the Al surface is then removed by etching so as to expose the Al surface on the probe pad surface. Due to the etching ratios of the TiN film, the interlayer insulation film 16b and so on, when the TiN film on the probe pad is removed by etching, there may occur a case that the interlayer insulation film 16b and so on exposed on the photodiode 40 are etched to expose the interlayer insulation film 16a on the photodiode 40.

As a result, the semiconductor die 50 in which the recess portion 19 extending from the front surface of the passivation film 18 to inside the interlayer insulation film 16a and so on is formed on the photodiode 40 is completed. Therefore, as shown in FIGS. 1 and 2, the recess portion 19 is surrounded by the light shield film 17 except at the opening on the recess portion 19 and except at the opening slit 20 of the light shield film 17 extending from the side surface of the recess portion 19 to the outside of the recess portion 19.

The forming of the opening slit 20 in the light shield film 17, that extends from the side surface of the recess portion 19 on the photodiode 40 to the outside of the recess portion 19 in this manner is a feature of the embodiment. With this opening slit 20, bubbles 29 taken in the recess portion 19 and the adhesive layer 22 compressed in the recess portion 19 are released toward the dicing region 21.

Although the opening slit 20 is formed only in the light shield film 17 in the embodiment, the opening slit 20 may be formed deeper by etching the interlayer insulation film 16b and so on exposed in the portion where the light shield film 17 is removed. In this case, the depth of the opening slit 20 approaches the depth of the recess portion 19, and this enables bubbles 29 deep in the recess portion 19 to be also discharged.

Furthermore, since a deep portion of the recess portion 19 is also connected to the opening slit 20, the adhesive layer 22 compressed in the deep portion of the recess portion 19, which has a high compressive stress, is also discharged to the opening slit 20. It is noted that the etching of the interlayer insulation film 16b and so on in the region of the opening slit 20 may be performed before the depositing of Al and so on for forming the light shield film 17. In this case, since it is not necessary to perform the process of forming the opening slit 20 in the light shield film 17, the opening slit 20 is covered by the light shield film 17 made of Al and so on and thus light does not leak to the region of the device elements through the opening slit 20.

Then, as shown in FIG. 5, an adhesive made of a transparent resin is applied to the surface of the semiconductor die 50, on which the photodiode 40 and so on are formed, the semiconductor die 50 is rotated to form the adhesive layer 22 having a uniform thickness between the semiconductor die 50 and the glass substrate 23, and the semiconductor die 50 and the glass substrate 23 are attached. Bubbles 29 taken in the recess portion 19 in this process and the adhesive layer 22 compressed in the recess portion 19 are released toward the opening slit 20 shown in FIG. 2 and so on. At this time, the semiconductor substrate 1 including a plurality of semiconductor dies 50 and the glass substrate 23 are attached with the adhesive layer 22 being interposed therebetween, although FIG. 5 shows one semiconductor die 50.

Then the semiconductor substrate 1 is etched from the back surface side by a predetermined method to expose the back surface of the pad electrodes 28 near the dicing region 21 in each of the semiconductor dies 50. The pad electrode 28 is formed on the surface of the semiconductor die 40 with the insulation film 14 being interposed therebetween and connected to the photodiode 40, the NPN bipolar transistor 30 or the like. Then the insulation film 24 covering the side surface and back surface of each of the semiconductor dies 50 is formed by a predetermined method.

Then the back surface wiring electrodes 25 connected to the back surfaces of the pad electrodes 28 and extending from the side surface to the back surface of the semiconductor die 50 are formed by a predetermined method. Then a protection film 26 such as a solder mask having openings is formed on the back surface of the semiconductor die 50, a solder is applied in the openings by screen-printing or the like to form the conductive terminals 27, and finally dicing is performed to divide the semiconductor dies 50, thereby completing the semiconductor devices 60.

Although the glass substrate 23 is used as a supporting substrate in the embodiment, the invention is not limited to the glass substrate 23 as long as a substrate transmits blue light like a transparent resin board. Furthermore, the back surface wiring electrode 25 may be formed so as to fill penetration holes penetrating the semiconductor substrate 1 from the back surface side of the semiconductor die 50 to the back surface of the pad electrode 28.

Since the semiconductor device 60 has the photodiode 40, light transmitting materials such as the glass substrate 23 and the adhesive layer 22 of a transparent resin are used in the embodiment. However, in a case of a semiconductor device having other device and so on having a recess portion that does not need light transparency, an adhesive layer made of a resin having no light transparency and so on or a supporting substrate made of a plastic or silicon substrate or the like may be used.

As explained above, since bubbles are not taken in an adhesive layer in a recess portion formed on a photodiode, there does not occur a problem in the yield and reliability of the semiconductor device by forming the recess portion.

What is claimed is:

1. A semiconductor device comprising:
   a semiconductor die;
   a semiconductor integrated circuit formed in a front surface portion of the semiconductor die and comprising a light receiving element;
   an insulation film disposed on the semiconductor integrated circuit and having a recess portion on the light receiving element;
   a light shield film disposed on the insulation film and having an opening on the recess portion and a slit extending, in a plan view of the light shield film, from the recess portion toward outside of the recess portion, the entire light shield film being made in one plane, and the slit and the opening having different shapes, the slit in the light shield film being an opening or a dent made by removing a portion of the light shield film;
   a pad electrode disposed on the semiconductor die and connected to the semiconductor integrated circuit;
   a supporting substrate attached to the front surface portion of the semiconductor die;
   an adhesive layer disposed between the semiconductor die and the supporting substrate so as to attach the supporting substrate to the front surface portion of the semiconductor die; and
   a back surface wiring electrode formed on a back surface of the semiconductor die and connected to the pad electrode.

2. The semiconductor device of claim 1, wherein the slit cuts through the light shield film.

3. The semiconductor device of claim 1, wherein the light shield film comprises a metal film.

4. The semiconductor device of claim 1, wherein the light receiving element comprises a Blu-ray compatible photodiode.

5. The semiconductor device of claim 1, wherein the supporting substrate comprises a glass substrate.

6. A method of manufacturing a semiconductor device, comprising:
   providing a semiconductor die comprising a semiconductor integrated circuit comprising a light receiving element formed on a front surface of the semiconductor die; forming an insulation film on the semiconductor integrated circuit; forming a recess portion on the light receiving element by etching the insulation film; forming a light shield film on the insulation film having the recess portion; patterning the light shield film so as to form an opening on the recess portion, to remove the light shield film from a dicing region and to form an opening slit extending from the recess portion toward outside of the recess portion; forming on the semiconductor die a pad electrode connected to the semiconductor integrated circuit near the dicing region; attaching a supporting substrate to the front surface of the semiconductor die using an adhesive; and forming a back surface wiring electrode connected to the pad electrode on a back surface of the semiconductor die, wherein the entire light shield film being made in one plane, and the slit and the opening having different shapes.

7. The method of claim 6, further comprising etching the insulation film exposed through the opening slit of the light shield film so that the opening slit extends into the insulation film.

8. The method of claim 6, wherein the light shield film comprises a metal film.

9. The method of claim 6, wherein the light receiving element comprises a Blu-ray compatible photodiode.

10. The method of claim 6, wherein the supporting substrate comprises a glass substrate.

* * * * *